(12) United States Patent
Ypma et al.

(10) Patent No.: US 11,054,813 B2
(45) Date of Patent: Jul. 6, 2021

(54) METHOD AND APPARATUS FOR CONTROLLING AN INDUSTRIAL PROCESS USING PRODUCT GROUPING

(71) Applicant: ASML NETHERLANDS B.V., Veldhoven (NL)

(72) Inventors: Alexander Ypma, Veldhoven (NL); David Frans Simon Deckers, Turnhout (BE); Franciscus Godefridus Casper Bijnen, Valkenswaard (NL); Richard Johannes Franciscus Van Haren, Waalre (NL); Weitian Kou, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 150 days.

(21) Appl. No.: 15/763,834

(22) PCT Filed: Sep. 21, 2016

(86) PCT No.: PCT/EP2016/072363
§ 371 (c)(1),
(2) Date: Mar. 27, 2018

(87) PCT Pub. No.: WO2017/060080
PCT Pub. Date: Apr. 13, 2017

(65) Prior Publication Data
US 2018/0307216 A1 Oct. 25, 2018

(30) Foreign Application Priority Data

Oct. 8, 2015 (EP) ..................................... 15189024
Sep. 12, 2016 (EP) ..................................... 16188375

(51) Int. Cl.
*G05B 19/418* (2006.01)
*G03F 7/20* (2006.01)
*G03F 9/00* (2006.01)

(52) U.S. Cl.
CPC ... *G05B 19/41875* (2013.01); *G03F 7/70325* (2013.01); *G03F 7/70508* (2013.01);
(Continued)

(58) Field of Classification Search
CPC .... G05B 19/41875; G05B 2219/45031; G03F 7/70325; G03F 7/70616; G03F 7/70625;
(Continued)

(56) References Cited

U.S. PATENT DOCUMENTS

2004/0241885 A1* 12/2004 Maeritz ............ G05B 19/41875
438/5
2005/0165731 A1 7/2005 Funk
(Continued)

FOREIGN PATENT DOCUMENTS

CN 1675603 9/2005
CN 102054092 5/2011
(Continued)

OTHER PUBLICATIONS

International Search Report and Written Opinion dated Jan. 25, 2017 in corresponding International Patent Application No. PCT/EP2016/072363.
(Continued)

*Primary Examiner* — Kenneth M Lo
*Assistant Examiner* — Michael W Choi
(74) *Attorney, Agent, or Firm* — Pillsbury Winthrop Shaw Pittman LLP

(57) ABSTRACT

In a lithographic process in which a series of substrates are processed in different contexts, object data (such as performance data representing overlay measured on a set of
(Continued)

substrates that have been processed previously) is received. Context data represents one or more parameters of the lithographic process that vary between substrates within the set. By principal component analysis or other statistical analysis of the performance data, the set of substrates are partitioned into two or more subsets. The first partitioning of the substrates and the context data are used to identify one or more relevant context parameters, being parameters of the lithographic process that are observed to correlate most strongly with the first partitioning. The lithographic apparatus is controlled for new substrates by reference to the identified relevant context parameters. Embodiments with feedback control and feedforward control are described.

20 Claims, 9 Drawing Sheets

(52) U.S. Cl.
CPC ...... *G03F 7/70525* (2013.01); *G03F 7/70616* (2013.01); *G03F 7/70625* (2013.01); *G03F 7/70633* (2013.01); *G03F 7/70641* (2013.01); *G03F 9/7092* (2013.01); *G05B 2219/45031* (2013.01); *Y02P 90/02* (2015.11)

(58) Field of Classification Search
CPC ............. G03F 7/70633; G03F 7/70641; G03F 9/7092; G03F 7/70508; G03F 7/70525; Y02P 90/22

USPC .......................................................... 700/121
See application file for complete search history.

(56) References Cited

U.S. PATENT DOCUMENTS

| | | | |
|---|---|---|---|
| 2007/0288219 A1* | 12/2007 | Zafar | ........................ G03F 1/84 703/14 |
| 2013/0311958 A1* | 11/2013 | Liu | .......................... G03F 1/144 716/53 |
| 2016/0148850 A1* | 5/2016 | David | ..................... H01L 22/20 438/5 |

FOREIGN PATENT DOCUMENTS

| | | |
|---|---|---|
| CN | 103582819 | 2/2014 |
| TW | 201131690 | 9/2011 |
| TW | 201338084 | 9/2013 |
| WO | 2004/019147 | 3/2004 |
| WO | 2015/049087 | 4/2015 |

OTHER PUBLICATIONS

Taiwan Office Action dated Jul. 25, 2017 in Taiwan Patent Application No. 105132456.
Chinese Office Action issued in corresponding Chinese Patent Application No. 201680072108.9, dated Apr. 8, 2020.

* cited by examiner

METHOD AND APPARATUS FOR CONTROLLING AN INDUSTRIAL PROCESS USING PRODUCT GROUPING

CROSS-REFERENCE TO RELATED APPLICATIONS

This application is the U.S. national phase entry of PCT patent application no. PCT/EP2016/072363, which was filed on Sep. 21, 2016, which claims the benefit of priority of European patent application no. 15189024.1, which was filed on Oct. 8, 2015, and European patent application no. 16188375.6, which was filed on Sep. 12, 2016, which are each incorporated herein in its entirety by reference.

BACKGROUND

Field of the Invention

The invention relates to methods of controlling an industrial process by feedback based on performance parameters measured on processed product units. An example of an industrial process for which the method has been developed is a lithographic process, which includes one or more steps of transferring a pattern from a patterning device onto a substrate using a lithographic apparatus. The invention further relates to a lithographic apparatus for an industrial process and to a computer program products for causing a data processing apparatus to implement the methods and apparatus described.

Related Art

A lithographic process is one in which a lithographic apparatus applies a desired pattern onto a substrate, usually onto a target portion of the substrate, after which various processing chemical and/or physical processing steps work through the pattern to create functional features of a complex product. The accurate placement of patterns on the substrate is a chief challenge for reducing the size of circuit components and other products that may be produced by lithography. In particular, the challenge of measuring accurately the features on a substrate which have already been laid down is a critical step in being able to position successive layers of features in superposition accurately enough to produce working devices with a high yield. So-called overlay should, in general, be achieved within a few tens of nanometers in today's sub-micron semiconductor devices, down to a few nanometers in the most critical layers.

Consequently, modern lithography apparatuses involve extensive measurement or 'mapping' operations before and after to the step of actually exposing or otherwise patterning the substrate at a target location. Many 'fingerprints' in the performance parameters can be identified, and feedback loops implementing advanced process control can be applied to improve the overall performance of the process.

Advanced process control (APC) identifies correctable variation in a performance parameter such as overlay, and applies one set of corrections to a lot (batch) of wafers. In determining these corrections, corrections from previous lots are taken into account in order to avoid overcorrecting the noise in the measurements. For adequate smoothing of current corrections with previous ones, the history of corrections taken into account should match the context of the current lot. "Context" in this regard encompasses any parameters that identify variants arising within the same overall industrial process. The layer ID, layer type, product ID, product type, reticle ID and so forth are all context parameters that may lead to different fingerprints in the finished performance. In addition to the individual scanners that may be used in a high-volume manufacturing facility, the individual tools used for each of the coating, etching, and other steps involved in semiconductor manufacturing can also vary from lot to lot or wafer to wafer. Each of these tools can impose a particular error "fingerprint" on the products. Outside the field of semiconductor manufacturing, similar situations may arise in any industrial process.

To ensure accurate feedback control appropriate to the particular context, different lots (batches) of product units can be treated as separate "threads" in the APC algorithms. Context data can be used to assign each product unit to the correct thread. In the case of a manufacturing plant producing usually high volumes of only a few types of products by the same process steps, the number of different contexts may be relatively small, and the number of product units in each thread will be ample to allow smoothing of noise. All of the lots having a common context can be assigned to their own thread to optimize the feedback correction and the ultimate performance. In case of a foundry producing many different types of product in very small production runs, the context may change more often, and the number of lots having exactly the same context data may be quite small. Using only the context data to assign lots to different APC 'threads' may then result in a large number of threads, with a small number of lots per thread. Complexity of the feedback control increases, and the ability to improve performance for low-volume products is reduced. Combing different lots into the same threads without sufficient regard to their different contexts will cause loss of performance also.

Different wafers within a lot may in practice have different contexts, but current control systems are not adapted to use this different context to allow effective per-wafer control.

A diagnostic apparatus for root cause analysis a lithographic manufacturing facility or other industrial process is described in published patent application WO2015049087A1.

SUMMARY OF THE INVENTION

The invention aims to improve control of industrial processes, including processes where the performance of the process for different product units may be influenced by different context. The invention in some embodiments aims to improve control in processes where one or more low-volume product lines are mixed with other product lines in a high-volume process. The invention in some embodiments aims to allow control in lithographic manufacturing processes.

The invention in a first aspect provides a method of controlling an industrial process, the method comprising:

(a) receiving object data representing one or more parameters measured in relation to a set of product units that have been subjected to the industrial process;

(b) receiving context data representing a plurality of context parameters that are parameters of the industrial process that vary between product units within the set;

(c) defining, by statistical analysis of the object data, a first partitioning that assigns membership of the product units of the set between two or more subsets, the product units in each subset sharing one or more characteristics observed in the object data;

(d) identifying, at least in part based on the first partitioning of the product units and the context data, a set of one or more relevant context parameters among the context parameters; and (e) controlling the industrial process for new product units at least partially by reference to the identified set of relevant context parameters among context parameters of the new product units.

The invention in a second aspect provides a control system for an industrial process, the control system comprising:

storage for object data representing one or more parameters measured in relation to a set of product units that have been subjected to the industrial process;

storage for context data representing a plurality of context parameters that are parameters of the industrial process that vary between product units within the set;

a first processor arranged to define, by statistical analysis of the object data, a first partitioning that assigns membership of the product units of the set between two or more subsets, the product units in each subset sharing one or more characteristics observed in the object data;

a second processor arranged to use the first partitioning of the product units and the context data to identify a set of one or more relevant context parameters among the context parameters, a most relevant context parameter being a parameter of the industrial process that is observed to correlate most strongly with the first partitioning;

a controller for controlling the industrial process for new product units by reference to the identified set of relevant context parameters among context parameters of the new product units.

The storage and the first and second processors can be implemented in the same data processing apparatus. The same data processing apparatus can optionally be programmed to serve as the controller.

In an embodiment, said industrial process comprises a sequence of one or more lithographic processing steps performed on product units in the form of substrates, each lithographic processing step comprising one or more lithographic patterning operations followed by one or more physical and/or chemical processing operations.

In some applications, the object data may include performance data representing one or more performance parameters measured on the set of product units after they have been subject to the industrial process. The performance parameters of subsets of previously processed product units are then used to generate feedback corrections for new product units, the subsets of the previously processed products being defined by reference to the identified relevant context parameters.

In other applications, the object data may include the object data relating to the set of product units includes data representing one or more parameters measured prior to or during performance of the industrial process on those product units. The object data for the set of product units includes data representing one or more parameters measured on product units of the set prior to or during performance of the industrial process.

Examples of such applications will be described further below, with reference to the accompanying drawings.

The invention further provides a computer program product comprising machine readable instructions for causing a general purpose data processing apparatus to implement all or part of a method and control system as set forth above.

Further features and advantages of the invention, as well as the structure and operation of various embodiments of the present invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which.

DETAILED DESCRIPTION OF EXEMPLARY EMBODIMENTS

Figure 1:
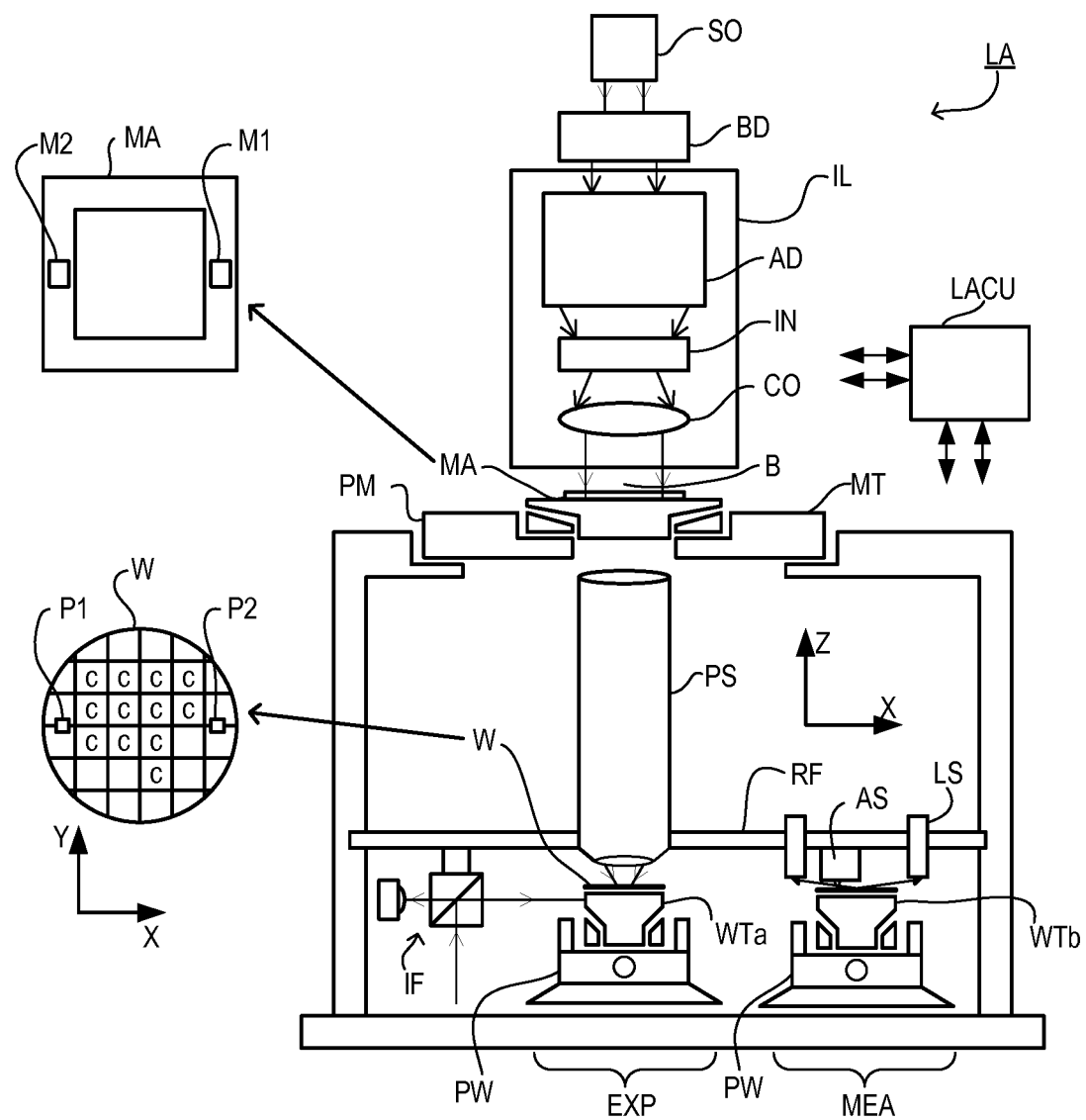
FIG. 1 depicts a lithographic apparatus according to an embodiment of the invention.

FIG. 1 schematically depicts a lithographic apparatus LA according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa or WTb constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:
1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.
2. In scan mode, the mask table MT and the substrate table WTa/WTb are scanned synchronously while a pattern imparted to the radiation beam is projected onto a target portion C (i.e. a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA in this example is of a so-called dual stage type which has two substrate tables WTa and WTb and two stations—an exposure station and a measurement station—between which the substrate tables can be exchanged. While one substrate on one substrate table is being exposed at the exposure station EXP, another substrate can be loaded onto the other substrate table at the measurement station MEA so that various preparatory steps may be carried out. The preparatory steps may include mapping the surface height of the substrate using a level sensor LS and measuring the position of alignment marks on the substrate using an alignment sensor AS. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus LA is to print product features at the correct locations with very high accuracy. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. The invention can be applied in apparatus with only one substrate table, or with more than two.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
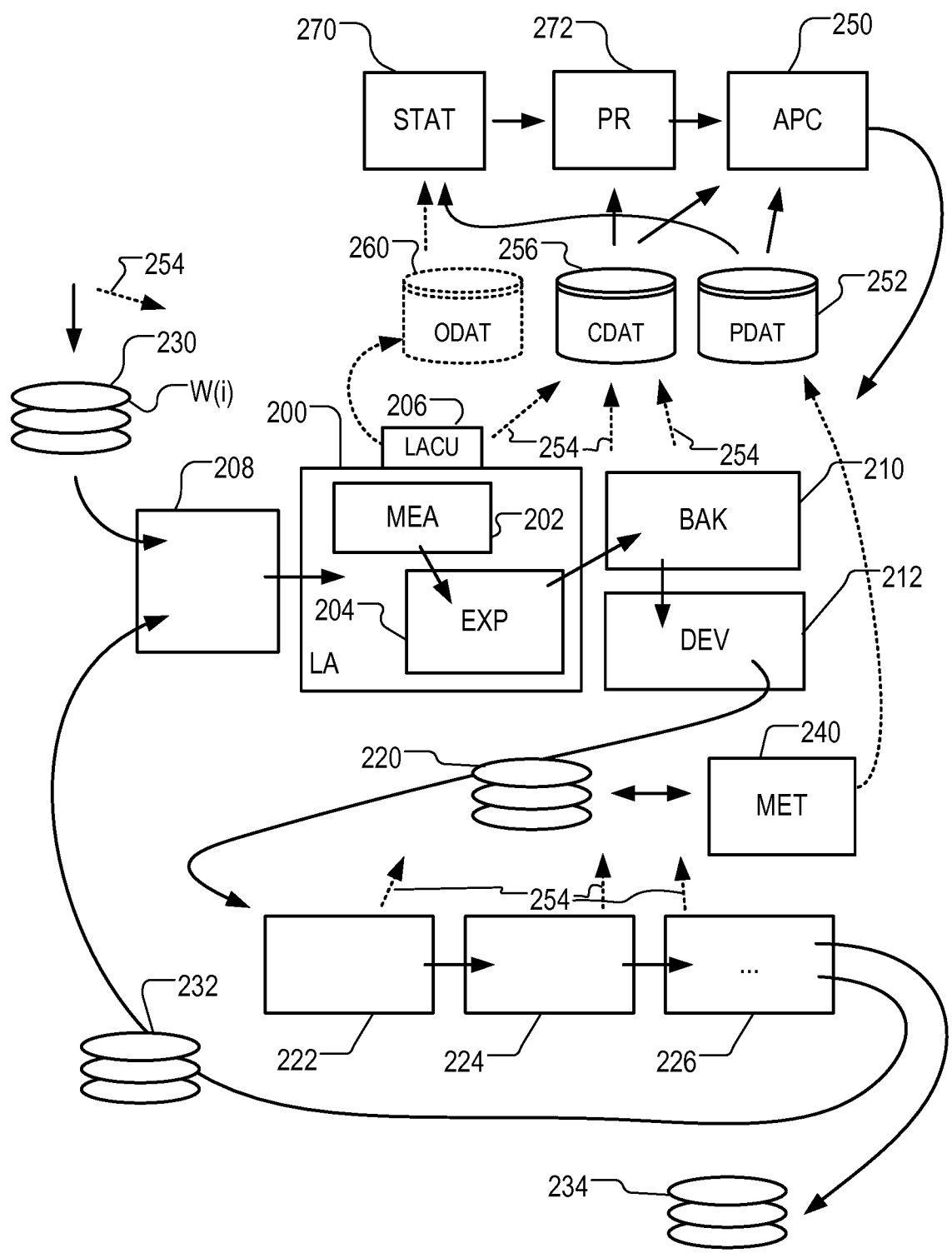
FIG. 2 shows schematically the use of the lithographic apparatus of FIG. 1 together with other apparatuses forming a manufacturing facility for semiconductor devices, the facility including a control apparatus according to embodiments of the present invention.

FIG. 2 at 200 shows the lithographic apparatus LA in the context of an industrial manufacturing facility for semiconductor products. Within the lithographic apparatus (or "litho tool" 200 for short), the measurement station MEA is shown at 202 and the exposure station EXP is shown at 204. The control unit LACU is shown at 206. Within the manufacturing facility, apparatus 200 forms part of a "litho cell" or "litho cluster" that contains also a coating apparatus 208 for applying photosensitive resist and other coatings to substrate W for patterning by the apparatus 200. At the output side of apparatus 200, a baking apparatus 210 and developing apparatus 212 are provided for developing the exposed pattern into a physical resist pattern.

Once the pattern has been applied and developed, patterned substrates 220 are transferred to other processing apparatuses such as are illustrated at 222, 224, 226. A wide range of processing steps are implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses. The described semiconductor manufacturing process comprising a sequence of patterning process steps is just one example of an industrial process in which the techniques disclosed herein may be applied. The semiconductor manufacturing process includes a series of patterning steps. Each patterning process step includes a patterning operation, for example a lithographic patterning operation, and a number of other chemical and/or physical operations.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

Also shown in FIG. 2 is a metrology apparatus 240 which is provided for making measurements of parameters of the products at desired stages in the manufacturing process. A common example of a metrology station in a modern lithographic manufacturing facility is a scatterometer, for example an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. As is also well known, the metrology results from the apparatus 240 can be used to maintain accurate performance of the patterning operations in the litho cluster, by making small adjustments over time, thereby minimizing the risk of products being made out-of-specification, and requiring re-work. Of course, metrology apparatus 240 and/or other metrology apparatuses (not shown) can be applied to measure properties of the processed substrates 232, 234, and incoming substrates 230.

To improve performance of the manufacturing process in parameters such as overlay, and CD, an advanced process control (APC) system 250 is provided. APC system 250 implements a form of feedback control based on historic performance data PDAT, which may include for example measurements of overlay and/or CD made by metrology apparatus 240, and on context data CDAT associated with individual substrates. APC system 250 therefore has access to historic performance data PDAT and which is stored in storage 252. The context data CDAT may also be regarded as "history" data, as it is data not obtained from the products themselves but representing all or part of the processing history of individual product units (wafers or other substrates), or batches of product units. Arrows 254 throughout the diagram illustrate how context data may come from any of the apparatuses. Context data may also arrive with the new substrates 230. For example, the context data may record what types of process steps have been applied, which individual apparatuses have been used in the performance of those steps, and what parameters were applied by those apparatuses (for example settings of temperature or pressure case while in etching apparatus 222, or parameters such as illumination modes, alignment recipes, etc. in the litho tool 200). The context data is stored in storage 256 for use by the APC system 252.

The performance data PDAT may be regarded as an example of object data used in some embodiments of the techniques disclosed herein. Other examples of object data may be collected and stored for used in other embodiments, and some embodiments may use different kinds of object data together, including performance data. While the performance data is derived from measurements made (directly or indirectly) on the product units that have previously gone through the processing steps being controlled, other object data ODAT may be collected in advance of or during performance of the processing. FIG. 2 shows this other object data optionally collected and stored in a database 260. Such other object data may be data measured on the product units themselves, or measured on other parts involved in the industrial process. As one example, the object data stored in a database 260 may comprise the alignment data conventionally obtained by the lithographic apparatus 200 using the alignment sensors AS in the measurement station 202. As this data representing detailed measurements of positions of marks in the X-Y plane of the substrate is obtained inherently as part of the normal patterning operation, little or no penalty is incurred by instructing the control unit 206 to store the data in the object data storage 260. Alternatively or in addition to the alignment data, the object data may include height data obtained using level sensor LS, "wafer quality" signals from the alignment sensors AS and the like. In other embodiments, the object data may include data measured elsewhere in the system, and not on the product units themselves. An example of such object data might be mask (reticle) alignment data obtained using the mask alignment marks M1, M2 and sensors in the substrate supports of the lithographic apparatus of FIG. 1.

In summary, the term "object data" as used in the introduction and claims encompasses a wide variety of data that may be gathered in the manufacturing facility, either for historic product units, or new product units to be processed. In particular term "object data" as used in the introduction and claims encompasses both the performance data PDAT (measured from processed product units after processing and stored in storage 252) and the other types of object data ODAT (measured from product units or other systems before and/or during processing and stored in storage 260). Examples using both types of object data will be described below with reference to FIGS. 5 and 6.

While FIG. 2 shows separate storage 252, 256, 260 for each of the context data, performance data and object data, it will be appreciated that these different types of data may be stored in one common storage unit, or may be distributed over a larger number of storage units, from which particular items of data can be retrieved when required. Further, whilst the context data 262 is shown as emanating from each individual apparatus 222, 224, etc. the data may be collected through a central control system that controls the operation of the lithocell and/or the manufacturing plant as a whole.

Each record in the context data and performance data storage is labeled with a unique identifier. Noting that an individual wafer might pass repeatedly through the same litho tool in the course of a manufacturing process, or might pass through different tools all measuring the same marks, it is possible collect data for the same product unit at different stages of the manufacturing process. Each of these instances of measurement can be treated in the analysis as an independent product unit. In the case where there are multiple instances of the same wafer being measured at different stages in a complex manufacturing process, however, the object data will include an identifier that uniquely identifies not only the individual wafer, but the stage of processing in which it has been measured. Typically in a lithographic process, different instances of the same substrate will be associated with patterning successive layers of a device structure.

Figure 3:
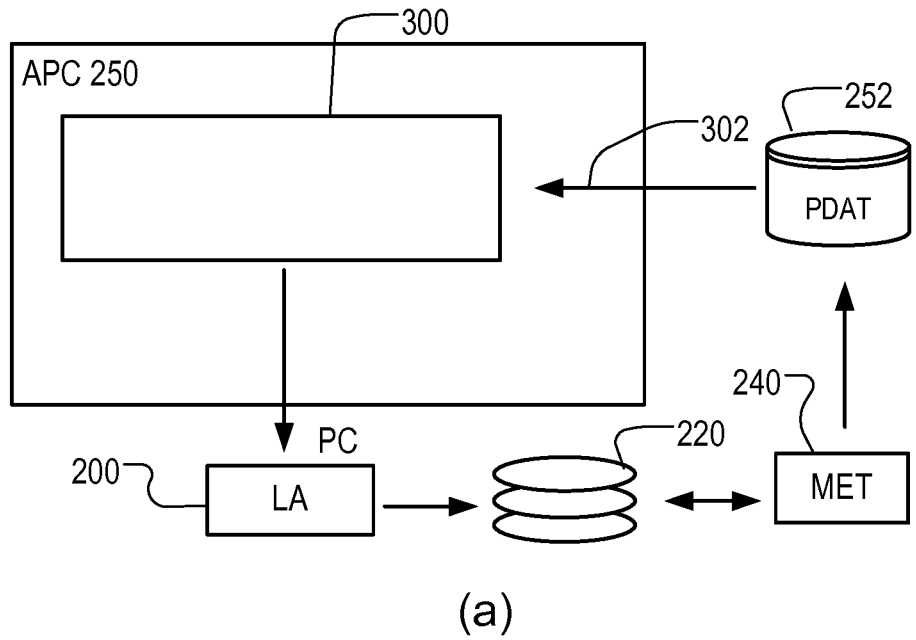
FIG. 3 illustrates schematically two known feedback control methods applied in a manufacturing facility of the type shown in FIG. 2.
Figure 3:
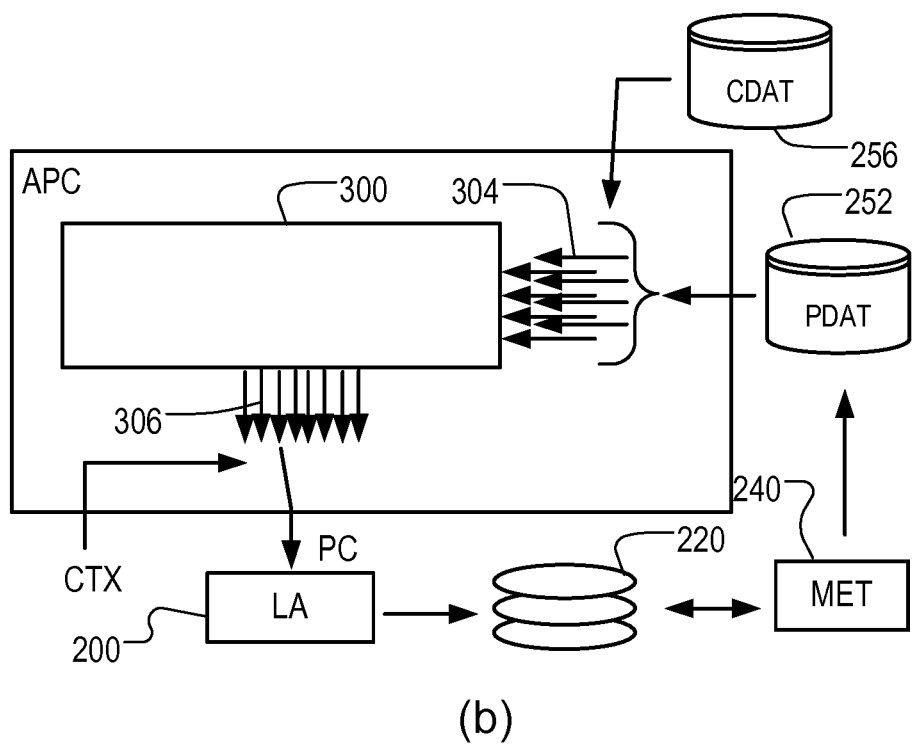

FIG. 3(a) illustrates schematically the operation of one type of control method implemented by APC system 250. Historic performance data PDAT is received from the storage 252, having been obtained by metrology apparatus 240 or other means from wafers 220 that have been processed by lithographic apparatus 200 and associated apparatuses of the lithocell. A feedback controller 300 analyzes the performance parameters represented in the performance data for recent lots, and calculates process corrections PC which are fed to the lithographic apparatus 200. These process corrections are added to the wafer-specific corrections derived from the alignment sensors and other sensors of the lithographic apparatus, to obtain a combined correction for the processing of each new lot.

FIG. 3(b) illustrates schematically the operation of another type of control method implemented by a known APC system 250. As can be seen, the general form of the feedback control method is the same as that shown in FIG. 3(a), but in this example, context data relating to the historic wafers and context data CTX relating to the current wafer is used to provide a more selective use of the performance data PDAT. Specifically, while in the earlier example the performance data for all historic wafers was combined in a single stream 302, and the modified method, context data from storage 256 used to assign the performance data for each historic lot to one of several threads 304. These threads are processed effectively in parallel feedback loops by feedback controller 300, yielding multiple process corrections 306, each based on the historic performance data of wafers in one of the threads 304. Then, when new ?lots are received for processing, their individual context data CTX can be used to select which of the threads provides the appropriate context data 306 for the current wafer.

In general, it will be seen that the operator of the manufacturing facility has to make decisions as to the granularity of the feedback control. In the example of FIG. 3(a), no granularity is applied, and all product units processed as a single thread. In the example of FIG. 3(b), then differing degrees of granularity may be provided, but always dependent on the suitable performance data and context criteria being known. In known practice, corrections will not normally be provided per individual wafer, but rather per lot. In cases where it is known that the individual wafer table or "chuck" has a strong influence on the performance, then corrections per lot and per chuck are known to be applied. In many cases, it will simply not be known in advance, which parameters of the context data relevant for defining optimum partitioning into threads, and which are not.

Accordingly, the lots may be partitioned into smaller threads than necessary, or grouped into larger threads when in fact a further partitioning would yield better performance.

Referring again to FIG. 2, a modified control system is proposed, in which historic object data, for example historic performance data, is assigned to threads based on context data, but based on a combination of statistical analysis of historic performance data and context information. A statistical analysis module 270 is provided which receives primarily the historic performance data PDAT from storage 252 and performs a data-driven partitioning of the historic product units. In a partition refining module 272, historic context data CDAT from storage 256 is used to refine the partitioning with reference to the context. In this way, relevant context data can be used to assign performance data into an appropriate thread, without unnecessarily proliferating the number of threads by reference to context data that is not in fact so relevant. One benefit of such a step is that production units whose context would place them in a very underpopulated thread with poor feedback performance as a result, can be assigned to a better populated thread that still provides effective performance improvement. While examples will firstly be described using performance data from storage 252, it has already been mentioned that in other examples other types of object data ODAT from storage 260 may be used, either instead of or in addition to performance data. Accordingly, unless the context requires otherwise, references to performance data in the present description should be understood as references to object data more generally.

Figure 4:
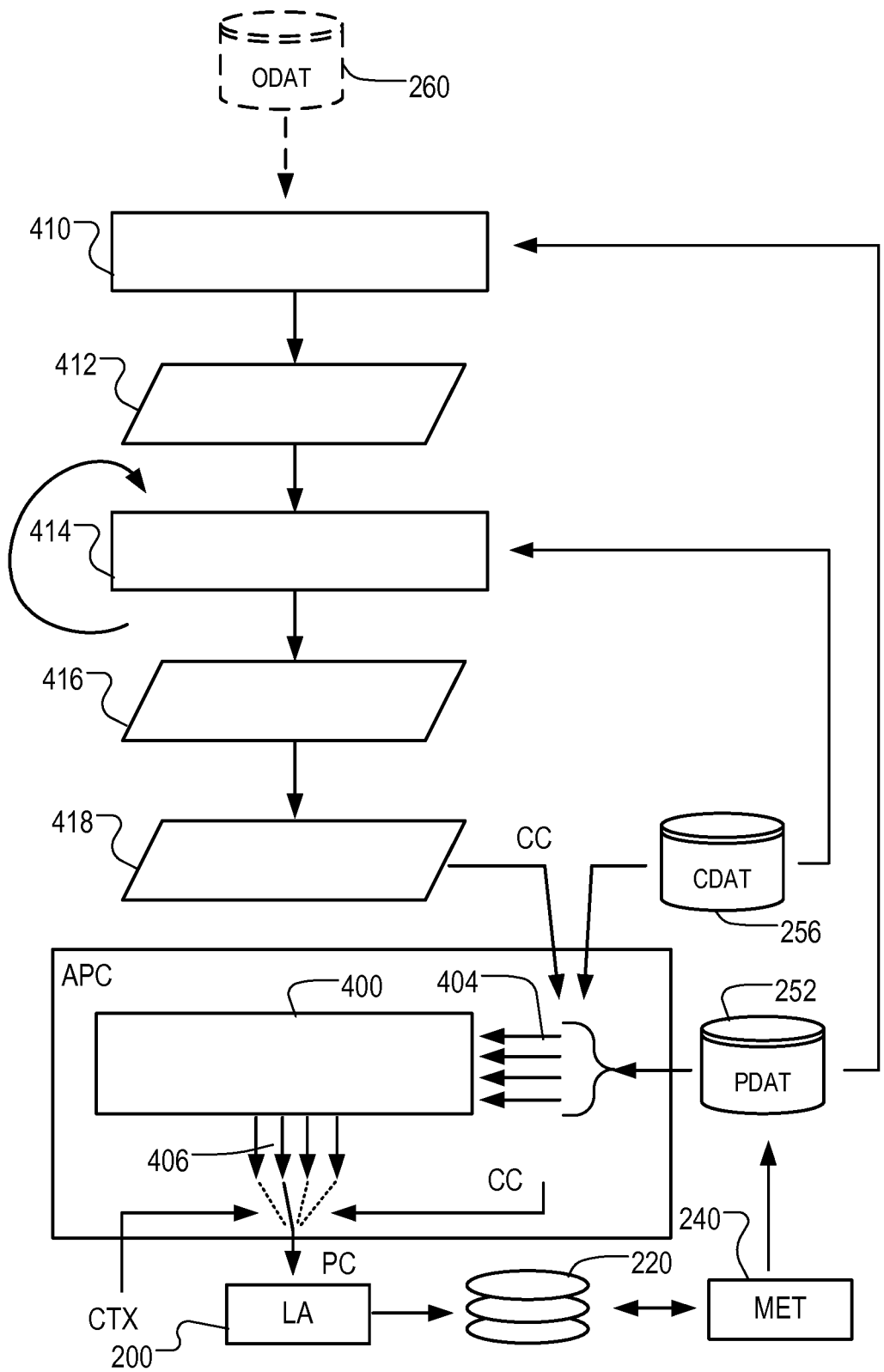
FIG. 4 illustrates schematically the operation of a feedback control method in accordance with one embodiment of the present disclosure.

FIG. 4 is a flowchart of the method implemented by the statistical analysis module 270 and partition refining module 272 in one embodiment of the control method illustrated in FIG. 2. A feedback controller 400 is shown at the bottom of the picture, which functions in a way very similar to the feedback controller 300 of FIG. 3(b). Historic performance data PDAT from storage 252 is assigned to different threads 404, in accordance with context data CDAT from storage 256. Feedback controller 400 produces process corrections for multiple threads 406, and chooses the appropriate process correction PC for a current wafer, using the current wafer context data CTX. Unlike the known method, however, threads 404 are not determined purely by reference to the historic context data, but are assigned also in light of context criteria CC that have been derived by a method that will now be described. These same context criteria are used in combination with the current wafer context data CTX, when choosing the process corrections to be applied on future wafers. Where the control systems allow it, process corrections can be chosen and applied on a per-wafer basis, or they may be applied per lot if preferred. Some types of performance data may only be available on a per-lot basis, and frequently detailed performance measurements are not made on every wafer. However, over many lots, wafers can be sampled in such a way as to discriminate statistically between different contexts on a per-wafer basis.

At step 410, a statistical analysis of the historic performance data PDAT is performed, without reference to the context data associated with the product units (wafers) on which performance parameters of the industrial process have been measured. Different forms of statistical analysis can be envisaged, and only a couple of examples will be mentioned for illustration here. In one example, step 410 comprises performing a multivariate analysis, for example principal component analysis (PCA), to identify a number of components contributing to performance parameters measured from the product units themselves (wafers in this case). Different forms of multivariate analysis may be used, and PCA analysis is referred to herein purely as one example. In the specific example case of PCA, the identified component vectors are orthogonal in the multidimensional space. In another method, called Independent Component Analysis (ICA), the component vectors are independent (meaning that none of them can be written as a linear combination of the others). The ICA technique leaves all second and higher order cross-correlations at zero, while the orthogonality of the PCA technique forces second order cross-correlations to be zero but may leave non-zero higher order cross-correlations. Step 410 and the analysis performed will be referred to hereinafter as the PCA analysis for convenience, without intending any limitation.

A detailed implementation of such statistical analysis in a lithographic manufacturing facility or other industrial process is described in published patent application WO2015049087A1. The contents of the application are hereby incorporated by reference. In the published patent application, statistical analysis such as PCA or another multivariate analysis is used to extract diagnostic information from object data, which may be performance data measured from product units after processing, and/or may include other object data, such as positional deviations measured using the alignment sensors prior to patterning. In the method now described, the purpose may be different, but the principles of the analysis and the form of the results can be similar to those in the prior published patent application. The diagnostic methods of the prior patent application can be implemented of course in the manufacturing facility at the same time as the control methods of the present application.

At step 412, the results of the statistical analysis are applied to define a first partitioning of the product units represented in the historic performance data. This partitioning is based on the position of each product unit in a multidimensional space defined by the principal component vectors, within the multidimensional space defined by the set of performance parameters measured and represented in the performance data PDAT. By "partitioning" we mean assignment of membership of each of the set of product units between two or more subsets. In a "hard" partitioning, each product unit is either a member of a certain subset or it isn't. A "soft" partitioning may also be used, in which a product unit is assigned membership values indicating degrees of membership, or probabilities of membership of more than one subset. The skilled reader will be able to adapt the present teaching to allow for soft partitioning. For simplicity of the present description, only hard partitioning will be illustrated.

Figure 5:
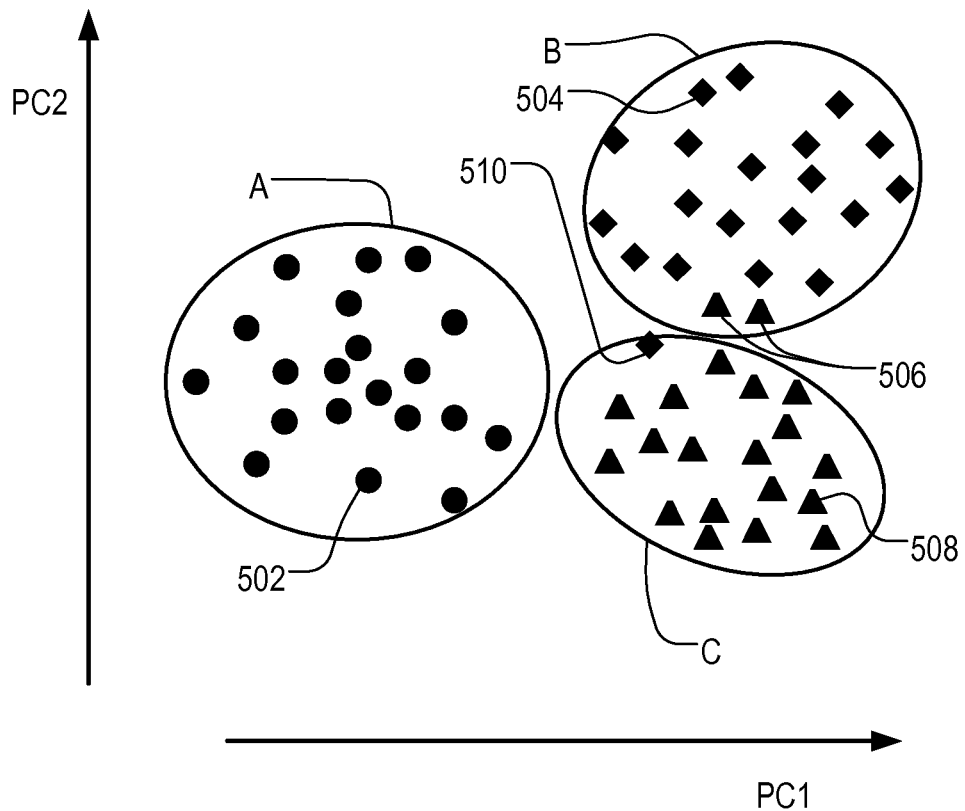
FIG. 5 and FIG. 6 illustrate different examples of automatic clustering of historical performance data, illustrating operation of the feedback control method of FIG. 4 in two example applications.

FIG. 5 illustrates figuratively the partitioning of product units into different subsets or "clusters", based on the results of the statistical analysis. Performance data for a number of product units is represented by points on a two-dimensional graph, whose axes are principal components PC1 and PC2 found by the statistical analysis. The product units in this example have been assigned to three clusters, labeled A, B and C. Thus, product unit represented by point 502 is initially assigned to cluster A, product units represented by points 504 and 506 are initially assigned to cluster B, and points 508 and 510 are initially assigned to cluster C. It should be borne in mind that this two-dimensional graph is only a simplified illustration, and partitioning may be performed based on three, four, 10 or more components.

Considering now the different context that applies to different product units within the population of product units represented in the historic performance data, the different shapes of the data points in FIG. 5 (diamond, circle, triangle) are used to indicate three different sub-populations. It may be assumed that different principal components represent error fingerprints caused by certain features or combinations of features in the processing context of each product unit. Consequently, it will be seen that the partitioning into clusters A, B and C has successfully grouped the majority of product units together with other members of the same sub-population (same shape of data point). When processing future units, only the context data will be available as a basis for controlling the processing. Therefore in the disclosed method, further steps are taken to identify from the statistical analysis and the historic context data, what are the relevant context parameters, out of all the context parameters applying to each product unit, for the purpose of controlling for future units.

Statistical analysis step 410 and the initial partitioning step 412 are performed deliberately without reference to the context data. Therefore it may be expected that some members of a sub-population (for example statistical outliers) may be assigned initially to the "wrong" cluster. Examples of this can be seen in the diamond shaped data point which has been grouped into cluster C, where the majority of data points are triangle shaped and so have a different context. Similarly, a couple of triangle shaped data points 506 have been grouped in cluster B, where the majority of points have diamond shape. Accordingly, if the statistical analysis of the historic performance data would be used as the only basis for partitioning product units into threads for the purposes of feedback control, the resulting process corrections for a given thread might contain undesirable contributions from product units having a context different to others in the thread.

Figure 6:
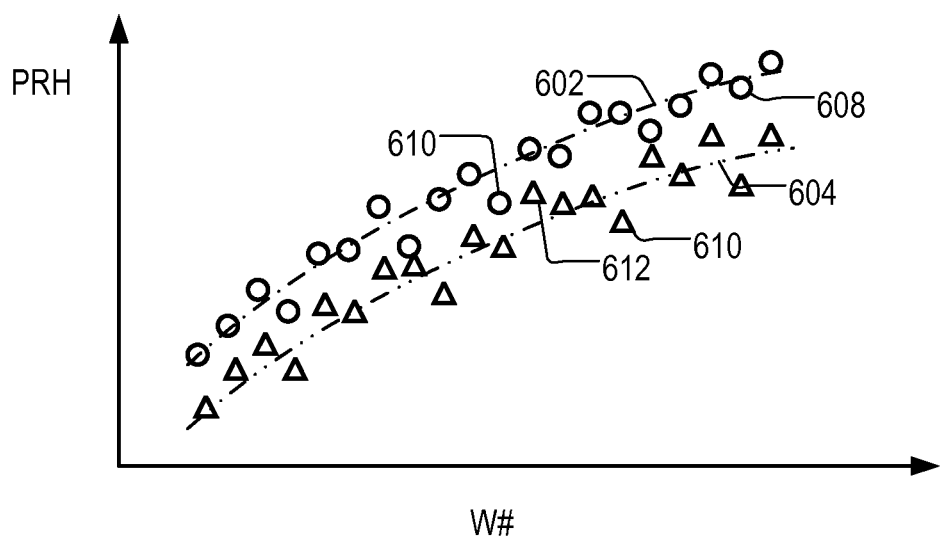

FIG. 6 illustrates another example of the type of statistical analysis that might be applied, in particular a mixed regression analysis. In the example of FIG. 6, the horizontal axis represents wafer number within a lot, passing through the lithographic apparatus 200. A lot may for example include 25 wafers in a typical semiconductor manufacturing facility. It is known that certain error fingerprints arise from thermal effects that build during exposure of a lot, and dissipate again prior to exposure of the next lot. An example of such an effect may be reticle (mask) heating, and a feedforward control system may define reticle heating corrections to be applied with a logarithmically increasing intensity through the course of the lot. In order to determine the appropriate logarithmic curve and intensity levels, statistical analysis of historic object data will generally be performed, rather than attempting to predict the required correction from any "first principles" calculation. As mentioned above the object data in such an example may be other than performance data measured on processed product units. It may be object data measured before or during processing on the product units, or on other parts of the system. An example of object data is alignment data measured from each wafer. Another example is mask alignment data measured using marks on the patterning device (mask or reticle) and sensors located beside the wafer on the substrate table or associated measurement table. Mask alignment data may be particularly useful in the example of identifying reticle heating fingerprints, illustrated in FIG. 6.

Analyzing the object data in terms of a reticle heating fingerprint PRH, data points from one or more lots may be plotted on a graph against wafer number, in the manner shown in FIG. 6. A regression analysis can be used to fit a logarithmic curve to the observed data in a well-known manner. From experience, however, it may be known that one or more context variables may also be at play, and no single logarithmic curve can be fitted to the data set. For such a case, it is possible to apply a mixture model. Mixture models can be based on regression, PCA, ICA and any other statistical model. As an example, a historic population of product units may have been processed on a mixture of tools, and each tool's performance may have drifted in a particular way over time. Provided the statistical database is sufficiently extensive, a mixture model can identify and separate these different contexts without prior knowledge.

Returning to FIG. 6, a mixed regression analysis, for example, will allow two, three more individual curves to be fitted, each associated with one sub-population in the data. The number of populations within the database may or may not be known or guessed in advance. In the example of FIG. 6, we suppose it is known that two curves 602 and 604 should be fitted. One reason for this might be that a lithographic apparatus such as the one illustrated in FIG. 1 has two chucks (substrate tables WTa and WTb), and the reticle heating errors observed appear different, depending on which wafer table is being used, because the sensors in two chucks have slightly different responses. Accordingly, the population of data points illustrated in FIG. 6 may in fact derive from two sub-populations of product units, which are illustrated in the drawing by circle data points 608, 610 etc. and triangle data points 612, 614 etc. The statistical analysis step 410, with no knowledge of the different context of these points may for example decide that data point belongs to the sub-population on which the second logarithmic curve 604 is to be fitted, while knowledge of the context of these product units might indicate that it belongs generally to the sub-population more relevant for the first logarithmic curve 602.

A reticle heating correction based on such regression analysis may be something that is applied as part of a feedforward control system within the lithographic apparatus, rather than being part of the advanced process control system 250. However, the problem remains that, for new product units, it is only the context that is known. Without prior knowledge of the significance of a particular context parameter (e.g. chuck ID), how is the control system to know which are the relevant context parameters for providing a feedforward control optimized for different contexts. If there are two populations found by the mixture model, are they cause by different chuck IDs or some other factor? Even if they are caused by two different chuck IDs, is it the chuck of the present apparatus or that of a tool previously used that is causing the difference, or a combination of both?

Another example of feedforward control is alignment process, already described in relation to the operation of the lithographic apparatus of FIG. 1. Alignment data measured per wafer is fitted with an alignment model that is used to generate corrections to be applied during patterning (exposure). Applying the principles of the present disclosure, it might be beneficial for alignment data measured for a new wafer to be used in a manner dependent on context data received with the new wafer. One way would be to vary the alignment model (potentially choosing between different alignment models) based on the context data. Analysis of historical alignment data with context data may identify which context parameters are relevant for choosing the most appropriate alignment model, per lot or even per wafer.

It should be noted that the object data used as input for the feedback control need not comprise individual measurements of position, overlay or some other parameter at points across the substrate. In one embodiment related to advanced process control of the type illustrated above, the existing APC feedback controller 300 is designed to work with performance data expressed through a parameterized model, for example expressing error fingerprints through coefficients of polynomial equations. Measurements taken from each wafer or group of wafers are considered together, and a model is fitted. In the modified feedback controller 400, the same parameterized model can be used, and the performance data for start wafers can be expressed in terms of that model. Similarly in the example of alignment data, the object data used may be parameters of a fitted alignment model, or residuals of a fitted model, rather than raw position data.

If the model has, for example, 10 parameters, then the performance data for each wafer or group of wafers becomes represented by a set of 10 values for those parameters, and the wafer or group of wafers can be represented by a point in a 10-dimensional parameter space. The same parameters can be used to express the corrections PC, and the lithographic apparatus can be designed to respond to these parameters, either directly or by translating them into another model space. The skilled person will appreciate that this is only one example of an indirect representation of performance data. It will be appreciated that, if 100 individual overlay measurements may be taken across each substrate, then to reduce these measurements to a 10-parameter model represents a substantial benefit in the compression of data. In general, there is little benefit in analyzing errors in a form that cannot be related directly or indirectly to the parameters of the corrections available in the control system of the lithographic apparatus or other industrial process. Of course, in other embodiments, different models may be defined, but the same principles may be applied.

Returning to FIG. 4, in step 414 context data CDAT from storage 256 is used and the disclosed method to refine the partitioning of the historic product units and their performance data, and in particular to impose a "logical" partitioning that is based on the statistical analysis, but makes sense when viewed in terms of the context data. An example of this refinement step will be described further below in more detail.

At 416, the refinement of partitioning is concluded and a final partitioning is defined. At 418, a set of context criteria CC has delivered by which the product units represented in the historic performance data and new product units can be assigned unambiguously to one of a number of subsets, corresponding to respective threads 404 and 406 of the feedback controller 400. The number of threads can be far fewer than if all parameters of the context data were to be used to define unique thread for every context. Using the statistical analysis, only those context parameters that are in fact associated with differences in performance need be used as a basis for partitioning the population of historic and future product units into threads.

The steps 410 to 418, along with the feedback controller 400 itself, can be implemented by a combination of computer hardware and software, connected to receive data from the manufacturing facility of FIG. 2. The computer hardware can be located in the same facility as the litho tool and other apparatus, or it can be located remotely and connected by telecommunications channels and/or removable storage.

Figure 7:
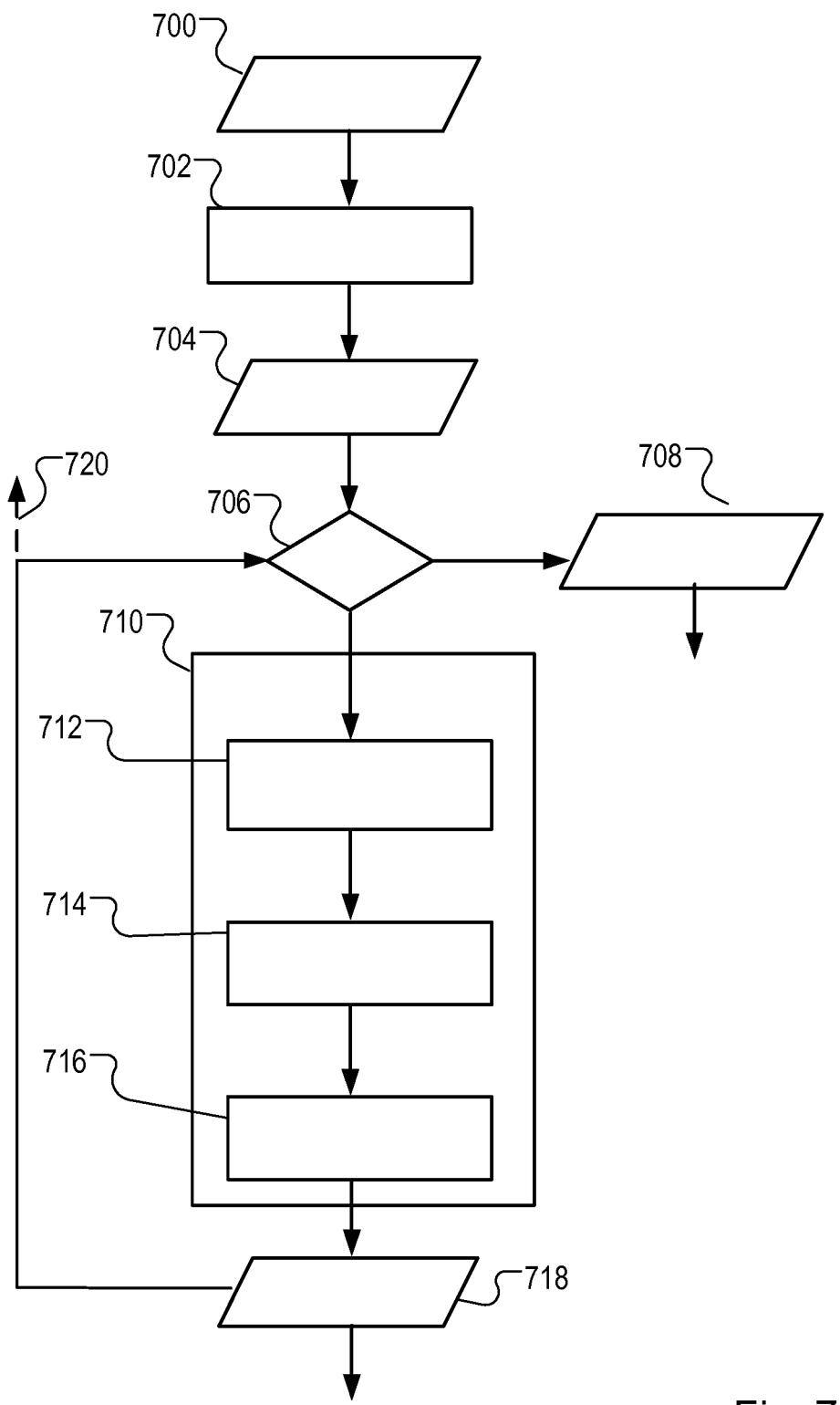
FIG. 7 is a more detailed flowchart of part of the method of FIG. 4.
Figure 8:
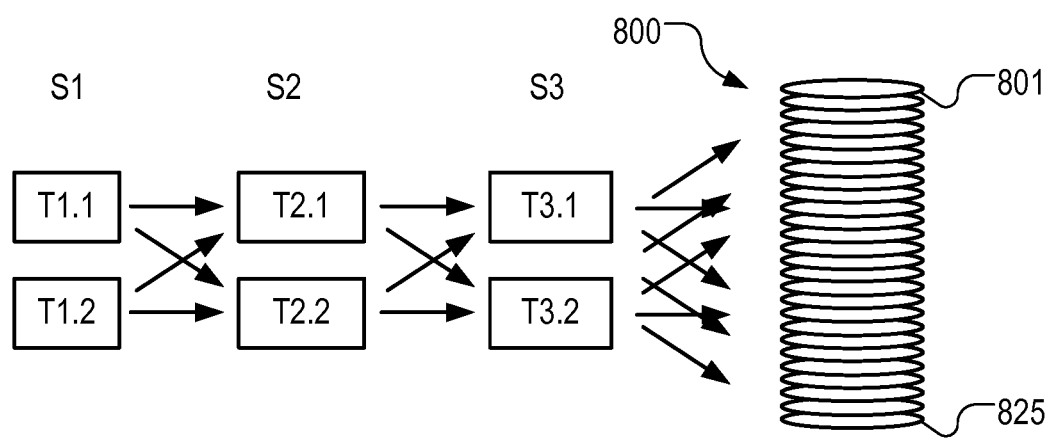
FIGS. 8 to 10 illustrate operation of the method of FIGS. 4 and 7 in a simple experiment performed in a real manufacturing facility.
Figure 9:
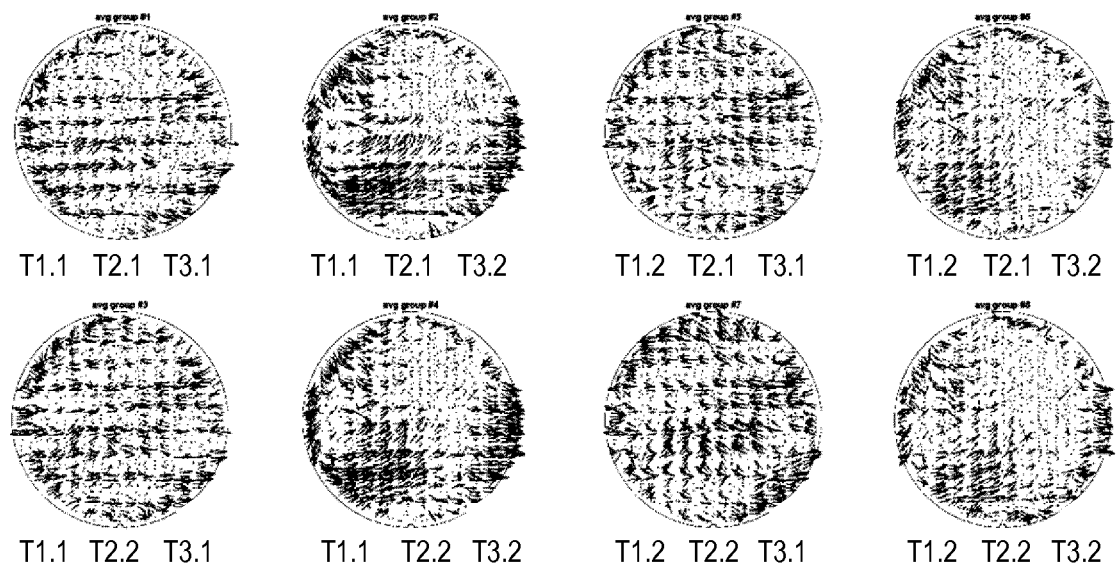
Figure 10:
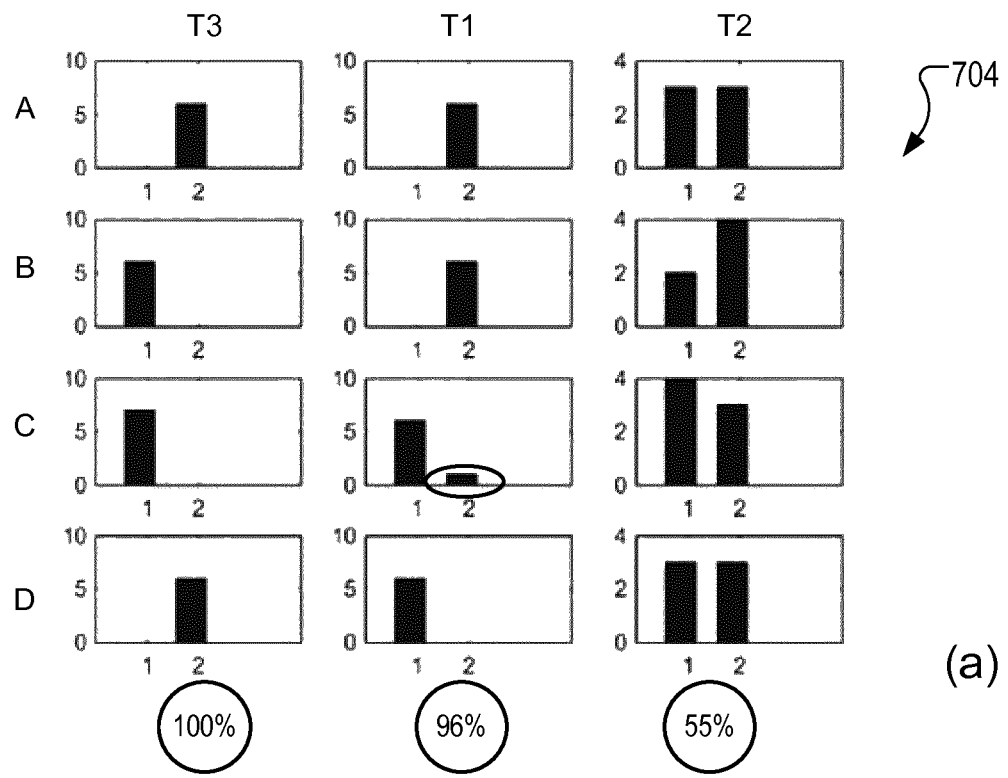
Figure 10:
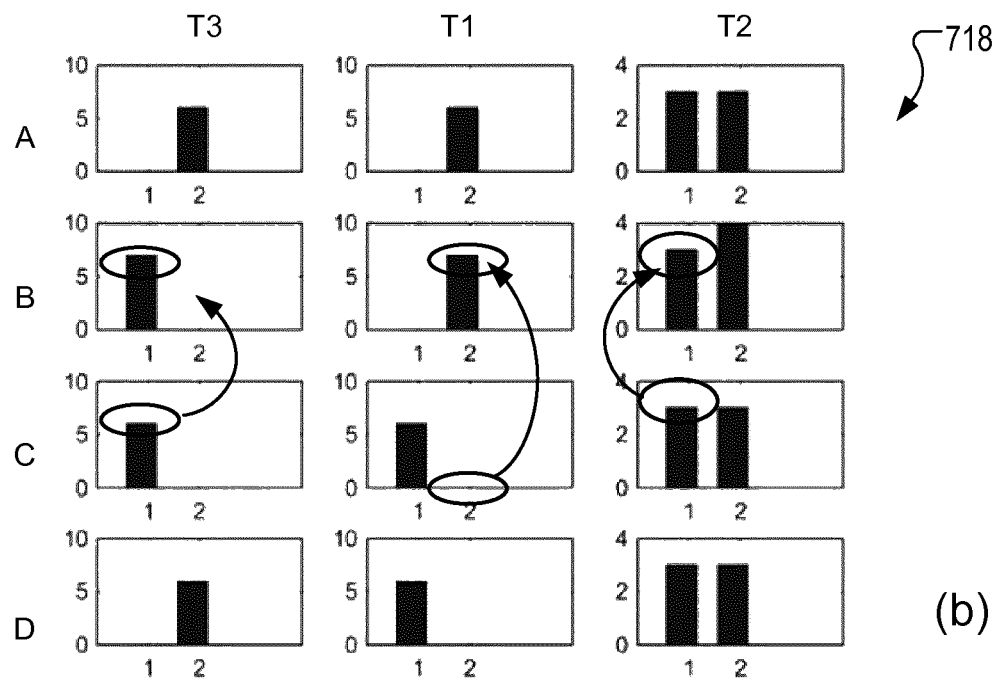
Figure 11:
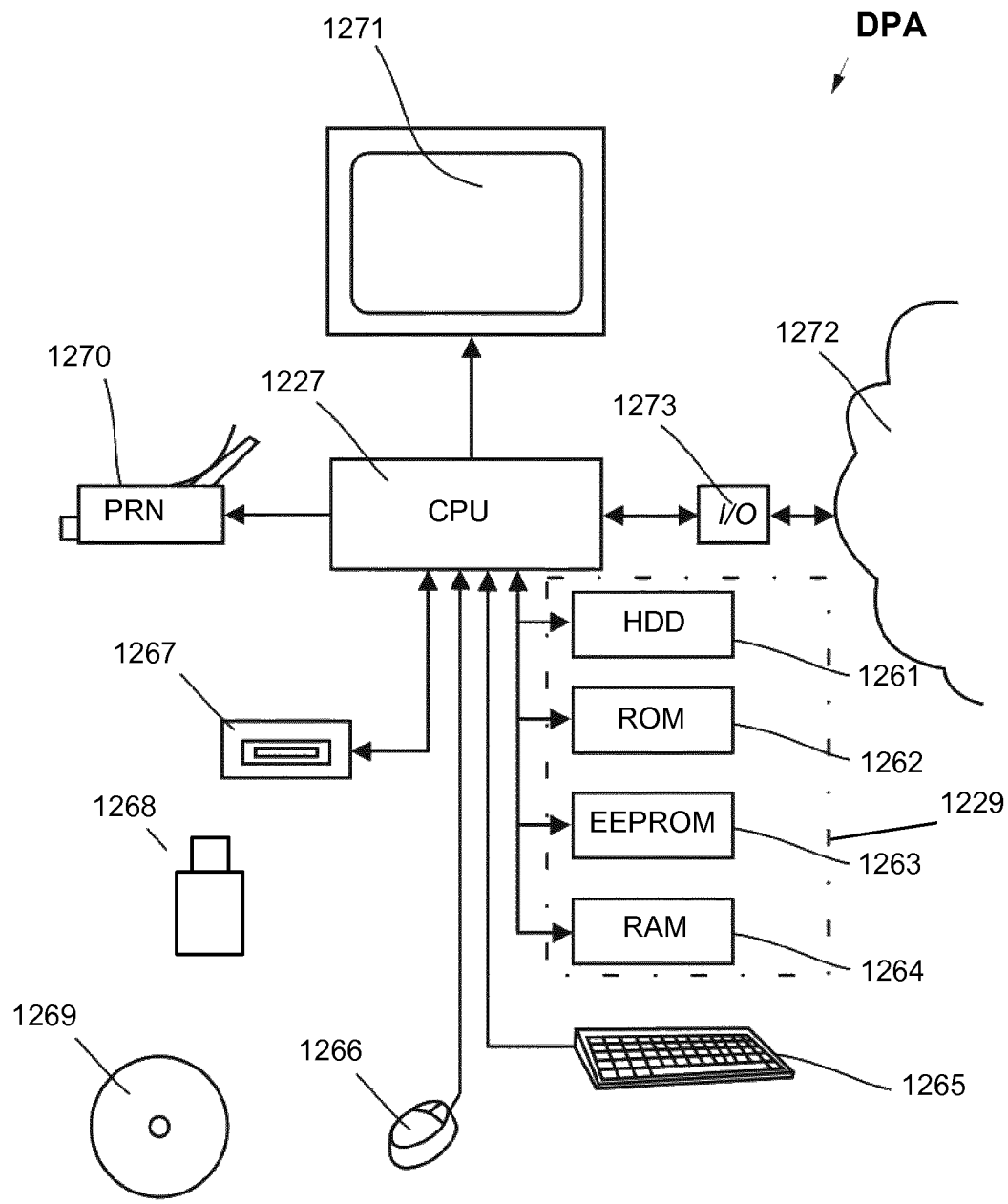
FIG. 11 illustrates schematically data processing hardware programmable to implement the methods and apparatuses of the embodiments of the invention.

FIG. 7 shows in more detail steps of initial partitioning and refining partitioning and a method of the type just described. A simple experimental example that has been implemented in a real semiconductor manufacturing facility is illustrated in FIGS. 8 to 10, and will be described to aid understanding.

As a first step, statistical analysis has been performed using principal component analysis on a population of historic wafers. With regard to a number of identified principal component vectors, each product unit is given a score, which effectively plots that product unit at a point in a multidimensional space. These PCA score values are received at step 700. At step 702, partitioning (clustering) is performed based on the PCA score values, to arrive at an initial partitioning 704. For a given number of clusters, each product unit is assigned a probability of membership of each cluster, and in the initial partitioning, each product unit is simply assigned to the cluster for which it has the highest probability. At 706, reference is made to the context data for the same product units, to determine whether the partitioning makes sense also in terms of the context data. A suitable test for this will be explained below, with reference to the experiment of FIGS. 8 to 10.

If the partitioning is already such that every cluster is uniquely defined by specific processing conditions defined in the context data, the final partitioning and context criteria CC are output at step 708. If not, then processing proceeds to step 710, where the partitioning is revised (step 414 in FIG. 4).

In order to refine the partitioning, at 712 the initial partitioning as compared with the various parameters of the context data to determine whether there is one predominant context parameter that can explain differences between the clusters arrived at by the statistical analysis. At 714, product units that are in the "wrong" cluster by reference to this dominant context parameter are identified. At 716, the results of the statistical analysis are revisited to identify for each of those product units the cluster which had the second highest probability in the data-driven clustering performed at step 702. These product units are reassigned into that next most likely cluster, to arrive at a revised partitioning 718.

The revised partitioning is a gain tested for agreement with the context data at step 706. In a case of full agreement, the current partitioning is output at 708, with a definition of those context criteria that are relevant for assigning future product units to individual threads. If the test at 706 reveals that there is still some disagreement between the revised partitioning and the context data, steps 712 to 716 are repeated, each time moving any "wrong" product units to the next most likely cluster.

In some situations, it may be necessary or desirable to repeat the statistical analysis after the partition has been revised, before identifying a next most relevant context parameter. This option is indicated at 720 in the flowchart. For example, this recalculation may be unnecessary in the PCA example of FIG. 5, but desirable in a mixture model analysis such as the mixture regression example of FIG. 6.

FIGS. 8 to 10 illustrate a simple experimental example that has been implemented in a real semiconductor manufacturing facility to demonstrate operation of the methods introduced above.

FIG. 8 illustrates the experimental procedure. A lot 800 comprising 25 wafers 801-825 was processed through certain steps S1, S2, S3 I a semiconductor manufacturing facility of the type shown in FIG. 2. In each step, a choice between two different apparatuses (tools) was made. Step S1 was performed for some wafers with tool T1.1 and for other wafers with a similar tool T1.2. Next the step S2 was performed using either tool T2.1 or tool 2.2, and finally step S3 was performed using either tool T3.1 or tool T3.2.

The patterns and procedures applied in the experiment were the same in all other respects. The only context parameters that varied are the tool choice parameters T1, T2, T3. That is to say, in this simplified experiment, context parameters such as product ID, reticle ID, layer ID, scanner ID and the like were not relevant, though in a real production situation they might be context parameters that vary, along with any number of further context parameters. In all, product units were processed with eight different contexts, each having a different combinations of the available tools. Using completely different tools for a given step is only one example of a context parameter that may be recorded in the context data for a given set of product units. In some cases, a context parameter may record choices of sub-systems within the tool. For example in the lithographic apparatus LA of FIG. 1, a pattern may be applied using one of two wafer tables ("chucks") WTa or WTb). In other cases (or for other context parameters within the same case), context parameters may record different settings of tools, or different modes of operation, or different environmental conditions.

FIG. 9 illustrates performance data in the form of overlay measurements, for eight sub-populations of wafers processed in the example of FIG. 8. Each of these plots represents the overlay measurements on a number of wafers, grouped according to their processing context. The particular combination of tools used for the steps S1, S2 and S3 is labeled beneath each plot. As a first point, it can clearly be seen that different contexts are associated with quite different patterns of overlay error, which may be a combination of one or more error fingerprints associated with one or more of the individual processing apparatuses or processing steps. Thus, looking at the variation of error fingerprints from left to right in FIG. 9, strong variations can be seen, while also some commonality can be seen between the first and third columns, and between the second and fourth columns. At the same time, very little difference can be seen between corresponding plots in the upper row of pots and the lower row of plots. By inspection of the labels, one can see from this example that the choice of tool T2.1 or T2.2 in step S2 is the difference between the upper plot and the lower plot and each column. By inspection of this simple example, therefore, one can suspect that the tool used in step S2 is not very relevant for overlay performance.

In a real situation, where hundreds or thousands of wafers may have hundreds or thousands of different processing contexts in a multi-dimensional context space, analysis by inspection is not generally an option. Only a full set of context parameters is known, and it is not known which among those context parameters are the most relevant context parameters influencing a particular performance parameter of interest. Where several performance parameters are of interest (e.g. overlay, CD, CD uniformity and so on), different context parameters may be relevant for each performance parameter, from among the same complete set of context parameters. Different control systems may be provided to correct different aspects of process performance and/or different properties of the product units as they are received. Therefore we seek a way to identify automatically for each control system a set of relevant context parameters from among all the known context parameters.

FIG. 10 illustrates how the method of FIG. 7, in which statistical analysis of the historic performance data is performed and then supplemented by application of context information, can provide an automatic identification of the relevant processing context parameters. In FIG. 10(*a*), we see in graphical terms of the correlation between (i) the initial partitioning 704 of the product units, obtained purely by statistical analysis of the performance data in the experiment of FIGS. 8 and 9 and (ii) the context data applicable to the product units. The statistical analysis has identified four clusters, which are represented by rows of histograms labeled A, B, C and D. Each histogram plots the members of that cluster against a different one of the context parameters, T1, T2, T3. It will be seen that there are 25 wafers in the lot, with six or seven members in each cluster. In a real high-volume manufacturing environment, there may be hundreds or thousands of wafers or other product units.

Identification of only four clusters is consistent with the observation in FIG. 9, that one of the context parameters (T2) makes no big difference to the overlay performance. In each cluster, roughly equal numbers of wafers have been processed by apparatuses T2.1 and T2.2. On the other hand, the choice of tool for steps S1 and S3 clearly has a strong correlation with the initial clustering. Each of the four clusters is predominantly associated with a particular combination of tools. Again, this is consistent with what can be seen by inspection in FIG. 9. Yet again, to observe such patterns by inspection is a luxury that is not present in real processing situations, with many variables of context, and many intermingled error fingerprints. However, in the disclosed method, a comparison of the context data with the data-based clustering can be used to identify automatically the relevant context parameters from among all the known context parameters.

In accordance with step 706, it can be identified that one of the product units in this example is in cluster C, spoiling the unique association between context criteria of chuck and hard mask apparatuses. Applying the processing of step 710 to this example, at 712, it may be determined that parameter T3 is the most dominant of the context parameters, in terms of discriminating between the clusters identified in the statistical analysis. T1, T2. As a test for dominance, a dominance score can eb calculated. As a simple example of a dominance score, it may be calculated, what percentage of the members of a cluster are in the highest column of the histogram, combined over all the clusters. The percentage scores for each cluster may be combined by simple averaging or in some other way. At the foot of each column, this percentage has been entered for the three context parameters of the experiment. In fact, the columns of histograms have been arranged in order of the degree of dominance identified in the statistical analysis, and that order is T3, With regard to parameter T3, in every cluster, 100% of the members are in a single column. Each of the clusters contains wafers with only a single value for parameter T3, so there is no disagreement between the context data and the data-driven partitioning in this parameter. The second most dominant parameter is then the parameter T1. A strong correlation is observed between parameter T1 and cluster ID, but in the case of cluster C the percentage of members in the highest column is not 100%. The dominance score percentage is 96% across all clusters. In other words, a violation of the unique association between cluster membership and context parameters occurs in the assignment of this member to cluster C, which was processed by tool T1.2 when all the other wafers in cluster C were processed by tool T1.1. This discrepancy is indicated by the oval highlight.

Referring now to FIG. 10(b), we see the revised partitioning 718, resulting from reassigning the circled wafer from cluster C to cluster B. This reassignment is illustrated figuratively by ovals and arrows. Testing the revised partitioning again at step 706, it will be found now that this second dominant parameter is also now fully in agreement with the revised partitioning. Furthermore, the third context parameter T2 will be found from the statistics to be largely irrelevant, because the histograms do not have a single column with a high percentage of the members. For example, a threshold percentage of 60%, 70% or 80% could be set, below which a context parameter is judged to be irrelevant. At each iteration of the loop shown in FIG. 7, the percentages will change, so that a next most relevant parameter may be judged after any reassignment.

The example of FIGS. 8 to 10 is based on a simple experiment with only eight possible contexts. In other experiments, the inventors have simulated operation of the methods described using real manufacturing data from a real manufacturing facility. In the associated context data, 180 different contexts could be identified. Accordingly, using the known approach of FIG. 3(b) would have resulted in 180 individual feedback control threads. Many of these threads would have contained only one or two lots an extended period of working, meaning that effective feedback control for that product type would really be impractical. Using the method of FIGS. 4 and 7 with the same data resulted in a partitioning of the product units into just 12 clusters, implying a more manageable number of 12 feedback control threads. Compared with alternative feedback techniques available in the prior art, the experiment showed that a measurable improvement in overlay could be obtained. Therefore, it may be expected that feedback control performance will be improved by following the present disclosure, in a high-mix manufacturing environment.

The skilled person will appreciate that there has been disclosed a structured, automatic way for identifying context parameters relevant to be used as context criteria in defining feedback control threads. In a high-mix environment, the problem of large numbers of threads may be addressed in this way. By providing a structured way to identify relevant context parameters, information may become available to allow a wafer by wafer process correction to be calculated, where previously only corrections specific to each lot could be envisaged, optionally with corrections specific to each chuck.

Variations may be envisaged. For example, prior to using all possible context parameters as potentially equally relevant, the context parameters may be weighted based on some kind of prior knowledge, using for example a Bayesian approach. To obtain this weighting, statistical correlations between the context parameters and the performance parameters could be observed.

The steps of the methods described above can be automated within any general purpose data processing hardware (computer), so long as it has access to the performance data and context data. The apparatus may be integrated with existing processors such as the lithography apparatus control unit LACU shown in FIG. 1 or an overall process control system. The hardware can be remote from the processing apparatus, even being located in a different country. Components of a suitable data processing apparatus (DPA) are shown in FIG. 12.

The apparatus may be arranged for loading a computer program product comprising computer executable code. This may enable the computer assembly, when the computer program product is downloaded, to implement the functions of the feedback control system as described above.

Memory 1229 connected to processor 1227 may comprise a number of memory components like a hard disk 1261, Read Only Memory (ROM) 1262, Electrically Erasable Programmable Read Only Memory (EEPROM) 1263 and Random Access Memory (RAM) 1264. Not all aforementioned memory components need to be present. Furthermore, it is not essential that aforementioned memory components are physically in close proximity to the processor 1227 or to each other. They may be located at a distance away The processor 1227 may also be connected to some kind of user interface, for instance a keyboard 1265 or a mouse

1266. A touch screen, track ball, speech converter or other interfaces that are known to persons skilled in the art may also be used.

The processor 1227 may be connected to a reading unit 1267, which is arranged to read data, e.g. in the form of computer executable code, from and under some circumstances store data on a data carrier, like a solid state memory 1268 or a CDROM 1269. The processor 1227 may also be connected to a printer 1270 to print out output data on paper as well as to a display 1271.

The processor 1227 may be connected to a communications network 1272, for instance a public switched telephone network (PSTN), a local area network (LAN), a wide area network (WAN) etc. by means of transmitters/receivers 1273 responsible for input/output (I/O). The processor 1227 may be arranged to communicate with other communication systems via the communications network 1272. In an embodiment of the invention external computers (not shown), for instance personal computers of operators, can log into the processor 1227 via the communications network 1272.

The processor 1227 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 1227 may even be located a distance away of the other processing units and communicate via communications network 1272. Connections between modules can be made wired or wireless.

The invention may further be described using the following clauses:

1. A method of controlling an industrial process performed on a series of product units, the method comprising:
   (a) receiving object data representing one or more parameters measured in relation to a set of product units that have previously been subjected to the industrial process;
   (b) receiving context data representing a plurality of context parameters that are parameters of the industrial process that vary between product units within the set;
   (c) by statistical analysis of the object data, defining a first partitioning that assigns membership of each of the set of product units between two or more subsets, the product units in each subset sharing one or more characteristics observed in the performance data;
   (d) using the first partitioning of the product units and the context data to identify a set of one or more relevant context parameters among the context parameters, a most relevant context parameter being a parameter of the industrial process that is observed to correlate most strongly with the first partitioning;
   (e) controlling the industrial process for new product units by reference to the identified set of relevant context parameters among context parameters of the new product units.

2. A method of controlling an industrial process, the method comprising:
   (a) receiving object data representing one or more parameters measured in relation to a set of product units that have been subjected to the industrial process;
   (b) receiving context data representing a plurality of context parameters that are parameters of the industrial process that vary between product units within the set;
   (c) defining, by statistical analysis of the object data, a first partitioning that assigns membership of the product units of the set between two or more subsets, the product units in each subset sharing one or more characteristics observed in the object data;
   (d) identifying, at least in part based on the first partitioning of the product units and the context data, a set of one or more relevant context parameters among the context parameters; and
   (e) controlling the industrial process for new product units at least partially by reference to the identified set of relevant context parameters among context parameters of the new product units.

3. A method according to any of the clauses 1 or 2, wherein the number of identified relevant context parameters used in step (e) is less than the number of context parameters identified in the received context data, so that some product units subjected to different variations of the industrial process are grouped together for controlling the industrial process in step (e).

4. A method according to any of the clauses 1 to 3, wherein step (d) comprises:
   (d1) using the first partitioning of the product units and the context data to identify a most relevant context parameter being a parameter of the industrial process that is observed to correlate most strongly with the first partitioning;
   (d2) using the most relevant context parameter to define a revised partitioning by re-assigning product units to a different subset if necessary to enforce a partitioning with respect to the most relevant context parameter;
   (d3) repeating step (d1) using the revised partitioning to identify a next most relevant context parameter;
   (d4) repeating step (d2) using the next most relevant context parameter to further revised the first partitioning, wherein steps (d3) and (d4) are performed one or more times to identify a desired set of relevant context parameters.

5. A method according to clause 4, wherein in step (c) each product unit is assigned to a subset having a highest probability according to the statistical analysis, and in step (d2) product units are re-assigned by placing them in a subset having a next highest probability according to the statistical analysis.

6. A method according to any of the preceding clauses, wherein the received object data for each product unit defines a vector representing that product unit in a multidimensional space, and wherein in step (c) the statistical analysis comprises a multivariate analysis to decompose the set of said vectors representing said product units in said multidimensional space into one or more component vectors, each of said component vectors representing one of said shared characteristics.

7. A method according to any of the preceding clauses, wherein the first partitioning is performed so as to minimize distance between members of each subset within a multidimensional space identified by said statistical analysis.

8. A method according to any of the preceding clauses, wherein the received object data for each product unit is derived from one or more parameters measured on the product unit at points spatially distributed across the product unit.

9. A method according to any of the preceding clauses, wherein the object data includes performance data representing one or more performance parameters measured on the set of product units after they have been subject to the industrial process.

10. A method as according to clause 9, wherein in step (e) the performance parameters of subsets of previously processed product units are used to generate feedback corrections for new product units, the subsets of the previously processed products being defined by reference to the identified relevant context parameters.

11. A method according to any of the clauses 8 or 10, wherein said performance parameters include one or more of overlay, critical dimension, side wall angle, wafer quality, focus.

12. A method according to any of the clauses 9, 10 or 11, wherein the received object data comprises parameters of a process model calculated using the measured performance parameters.

13. A method according to clause 12, wherein the process model is the same as a process model used to generate the feedback corrections in step (e).

14. A method according to any of the preceding clauses, wherein the object data relating to the set of product units includes data representing one or more parameters measured prior to or during performance of the industrial process on those product units.

15. A method according to clause 14, wherein the object data for the set of product units includes data representing one or more parameters measured on product units of the set prior to or during performance of the industrial process.

16. A method according to any of the preceding clauses, wherein in step (e) feedforward corrections are generated and applied in processing of the new product units to modify a feedforward control by reference to the identified relevant context parameters among context parameters of the new product units.

17. A method according to any of the preceding clauses, wherein in step (e) object data of the new product units is used to generate feedforward corrections for new product units, the manner of generating the feedforward corrections being defined by reference to the identified relevant context parameters among context parameters of the new product units.

18. A method according to any of the preceding clauses, wherein the product units are processed in lots and wherein the relevant context parameters include context parameters that vary for individual product units and not only for the lot as a whole.

19. A method according to any of the preceding clauses, wherein wherein in step (c) the statistical analysis comprises a mixture model analysis.

20. A method according to any of the preceding clauses, wherein said industrial process comprises a sequence of one or more patterning process steps performed on product units in the form of substrates, each patterning process step comprising one or more patterning operations followed by one or more physical and/or chemical processing operations.

21. A control system for an industrial process performed on a series of product units, the control system comprising:
 storage for object data representing one or more parameters measured in relation to a set of product units that have previously been subjected to the industrial process;
 storage for context data representing a plurality of context parameters that are parameters of the industrial process that vary between product units within the set;
 a first processor arranged to define, by statistical analysis of the object data, a first partitioning that assigns membership of each of the set of product units between two or more subsets, the product units in each subset sharing one or more characteristics observed in the performance data;
 a second processor arranged to use the first partitioning of the product units and the context data to identify a set of one or more relevant context parameters among the context parameters, a most relevant context parameter being a parameter of the industrial process that is observed to correlate most strongly with the first partitioning;
 a controller for controlling the industrial process for new product units by reference to the identified set of relevant context parameters among context parameters of the new product units.

22. A control system for an industrial process, the control system comprising:
 storage for object data representing one or more parameters measured in relation to a set of product units that have been subjected to the industrial process;
 storage for context data representing a plurality of context parameters that are parameters of the industrial process that vary between product units within the set;
 a first processor arranged to define, by statistical analysis of the object data, a first partitioning that assigns membership of the product units of the set between two or more subsets, the product units in each subset sharing one or more characteristics observed in the object data;
 a second processor arranged to use the first partitioning of the product units and the context data to identify a set of one or more relevant context parameters among the context parameters; and
 a controller for controlling the industrial process for new product units at least partially by reference to the identified set of relevant context parameters among context parameters of the new product units.

23. A control system according to any of the clauses 21 or 22, wherein the number of identified relevant context parameters used in step (e) is less than the number of context parameters identified in the received context data, so that some product units subjected to different variations of the industrial process are grouped together for controlling the industrial process by said controller.

24. A control system according to any of the clauses 21 to 23, wherein the second processor is arranged for:
 (d1) using the first partitioning of the product units and the context data to identify a most relevant context parameter being a parameter of the industrial process that is observed to correlate most strongly with the first partitioning;
 (d2) using the most relevant context parameter to define a revised partitioning by re-assigning product units to a different subset if necessary to enforce a partitioning with respect to the most relevant context parameter;
 (d3) repeating step (d1) using the revised partitioning to identify a next most relevant context parameter;
 (d4) repeating step (d2) using the next most relevant context parameter to further revised the first partitioning,
 wherein steps (d3) and (d4) are performed one or more times to identify a desired set of relevant context parameters.

25. A control system according to clause 24, wherein the first processor is arranged such that each product unit is assigned to a subset having a highest probability according to the statistical analysis, and the second processor is arranged so that in step (d2) product units are re-assigned by placing them in a subset having a next highest probability according to the statistical analysis.

26. A control system according to any of the clauses 21 to 25 wherein the stored object data for each product unit defines a vector representing that product unit in a multi-dimensional space, and wherein in the first processor the statistical analysis comprises a multivariate analysis to decompose the set of said vectors representing said product units in said multidimensional space into one or more component vectors, each of said component vectors representing one of said shared characteristics.

27. A control system according to any of the clauses 21 to 26, wherein the first partitioning is performed so as to minimize distance between members of each subset within a multidimensional space identified by said statistical analysis.

28. A control system according to any of the clauses 21 to 27, wherein the stored object data for each product unit is derived from one or more parameters measured on the product unit at points spatially distributed across the product unit.

29. A control system according to any of the clauses 21 to 28, wherein the object data includes performance data representing one or more performance parameters measured on the set of product units after they have been subject to the industrial process.

30. A control system according to clause 29, wherein in the controller the performance parameters of subsets of previously processed product units are used to generate feedback corrections for new product units, the subsets of the previously processed products being defined by reference to the identified relevant context parameters.

31. A control system according to any of the clauses 29 or 30 wherein said performance parameters include one or more of overlay, critical dimension, side wall angle, wafer quality, focus.

32. A control system according to any of the clauses 29, 30 or 31, wherein the received object data comprises parameters of a process model calculated using the measured performance parameters.

33. A control system according to clause 32 wherein the process model is the same as a process model used to generate the feedback corrections in the controller.

34. A control system according to any of the clauses 21 to 33 wherein the object data relating to the set of product units includes data representing one or more parameters measured prior to or during performance of the industrial process on those product units.

35. A control system according to clause 34, wherein the object data for the set of product units includes data representing one or more parameters measured on product units of the set prior to or during performance of the industrial process.

36. A control system according to any of the clauses 21 to 35, wherein in the controller feedforward corrections are generated and applied in processing of the new product units to modify a feedforward control by reference to the identified relevant context parameters among context parameters of the new product units.

37. A control system according to any of the clauses 21 to 36, wherein in the controller object data of the new product units is used to generate feedforward corrections for new product units, the manner of generating the feedforward corrections being defined by reference to the identified relevant context parameters among context parameters of the new product units.

38. A control system according to any of the clauses 21 to 37, wherein the product units are processed in lots and wherein the relevant context parameters include context parameters that vary for individual product units and not only for the lot as a whole.

39. A control system according to any of the clauses 21 to 38, wherein in the first processor the statistical analysis comprises a mixture model analysis.

40. A control system according to any of the clauses 21 to 39, wherein said industrial process comprises a sequence of one or more patterning process steps performed on product units in the form of substrates, each patterning process step comprising one or more patterning operations followed by one or more physical and/or chemical processing operations.

41. A computer program product comprising machine readable instructions for causing a general purpose data processing apparatus to perform the steps (a) to (d) of a method according to any of the clauses 1 to 20.

42. A computer program product comprising machine readable instructions for causing a general purpose data processing apparatus to perform the steps (a) to (e) of a method as according to any of the clauses 1 to 20 for controlling an industrial process.

43. A computer program product comprising machine readable instructions for causing a general purpose data processing apparatus to implement the storage and the first and second processors of a control system according to any of the clauses 21 to 40.

44. A computer program product comprising machine readable instructions for causing a general purpose data processing apparatus to implement a control system according to any of the clauses 1 to 20.

45. A lithographic system including a control system according to any of the clauses 21 to 40.

The computer system can be any signal processing system with analogue and/or digital and/or software technology arranged to perform the functions discussed here.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. As in the example of lithography. The set of measurements that is subjected to statistical analysis can be measurements made for different product units, and/or different instances of measuring the same product units. Although specific reference may have been made above to the use of embodiments of the invention in the context of optical lithography, it will be appreciated that the invention may be used in other types of lithography, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

As already mentioned, the invention may be applied in industrial processing applications quite separate from lithography. It will be understood that "high-mix" manufacturing applications, where different product units are subject to generally similar processing, but with differences in the individual units and/or their handling. Examples might be in production of optical components, automotive manufacture, and any number of other volume manufacturing situations.

The descriptions above are intended to be illustrative, not limiting. Thus, it will be apparent to one skilled in the art that modifications may be made to the invention as described without departing from the spirit and scope of the claims set out below. In addition, it should be appreciated that structural features or method steps shown or described in any one embodiment herein can be used in other embodiments as well.

The invention claimed is:

1. A method of controlling an industrial process, the method comprising:
   receiving object data representing one or more parameters measured in relation to a set of product units that have been subjected to chemical, physical, electrical or mechanical processing of the industrial process;
   receiving context data representing a plurality of context parameters that are parameters of the industrial process that vary between product units within the set;
   defining, by statistical analysis of the object data, a first partitioning that assigns membership of the product units of the set between two or more subsets, the product units in each subset sharing one or more characteristics observed in the object data;
   identifying, at least in part based on the first partitioning of the product units and the context data, a set of one or more relevant context parameters among the context parameters; and
   controlling the industrial process for new product units at least partially by reference to the identified set of relevant context parameters among context parameters of the new product units,
   wherein the number of identified relevant context parameters used to control the industrial process for the new product units is less than the number of context parameters identified in the received context data, so that some product units subjected to different variations of the industrial process are grouped together for the control of the industrial process for the new product units.

2. The method as claimed in claim 1, wherein identifying the set of one or more relevant context parameters comprises:
   (1) using the first partitioning of the product units and the context data to identify a most relevant context parameter being a parameter of the industrial process that is observed to correlate most strongly with the first partitioning;
   (2) using the most relevant context parameter to define a revised partitioning by re-assigning product units to a different subset if necessary to enforce a partitioning with respect to the most relevant context parameter;
   (3) repeating step (1) using the revised partitioning to identify a next most relevant context parameter; and
   (4) repeating step (2) using the next most relevant context parameter to further revise the first partitioning,
   wherein steps (3) and (4) are performed one or more times to identify a desired set of relevant context parameters.

3. The method as claimed in claim 2, wherein in defining the first partitioning each product unit is assigned to a subset having a highest probability according to the statistical analysis, and in step (2) product units are re-assigned by placing them in a subset having a next highest probability according to the statistical analysis.

4. The method as claimed in claim 1, wherein the received object data for each product unit defines a vector representing that product unit in a multi-dimensional space, and wherein in defining the first partitioning the statistical analysis comprises a multivariate analysis to decompose the set of the vectors representing the product units in the multidimensional space into one or more component vectors, each of the component vectors representing one of the shared characteristics.

5. The method as claimed in claim 1, wherein the first partitioning is performed so as to minimize distance between members of each subset within a multidimensional space identified by the statistical analysis.

6. The method as claimed in claim 1, wherein the received object data for each product unit is derived from one or more parameters measured on the product unit at points spatially distributed across the product unit.

7. The method as claimed in claim 1, wherein the object data includes performance data representing one or more performance parameters measured on the set of product units after they have been subject to the industrial process.

8. The method as claimed in claim 7, wherein in controlling the industrial process for the new product units the performance parameters of subsets of previously processed product units are used to generate feedback corrections for new product units, the subsets of the previously processed products being defined by reference to the identified relevant context parameters.

9. The method as claimed in claim 7, wherein the performance parameters include one or more selected from: overlay, critical dimension, side wall angle, wafer quality, and/or focus.

10. The method as claimed in claim 7, wherein the received object data comprises parameters of a process model calculated using the measured performance parameters.

11. The method as claimed in claim 1, wherein in controlling the industrial process for the new product units feedforward corrections are generated and applied in processing of the new product units to modify a feedforward control by reference to the identified relevant context parameters among context parameters of the new product units.

12. The method as claimed claim 1, wherein in controlling the industrial process for the new product units, object data of the new product units is used to generate feedforward corrections for the new product units, the manner of generating the feedforward corrections being defined by reference to the identified relevant context parameters among context parameters of the new product units.

13. A control system for an industrial process, the control system comprising:
   storage for object data representing one or more parameters measured in relation to a set of product units that have been subjected to chemical, physical, electrical or mechanical processing of the industrial process;
   storage for context data representing a plurality of context parameters that are parameters of the industrial process that vary between product units within the set; and
   a processor system configured to:
      define, by statistical analysis of the object data, a first partitioning that assigns membership of the product units of the set between two or more subsets, the product units in each subset sharing one or more characteristics observed in the object data;
      use the first partitioning of the product units and the context data to identify a set of one or more relevant context parameters among the context parameters; and
      control the industrial process for new product units at least partially by reference to the identified set of relevant context parameters among context parameters of the new product units;

wherein the number of identified relevant context parameters used to control the industrial process for the new product units is less than the number of context parameters identified in the received context data, so that some product units subjected to different variations of the industrial process are grouped together for the control of the industrial process for the new product units.

14. A non-transitory computer program product comprising machine readable instructions configured to cause a data processing apparatus to at least:

receive object data representing one or more parameters measured in relation to a set of product units that have been subjected to chemical, physical, electrical or mechanical processing of an industrial process;

receive context data representing a plurality of context parameters that are parameters of the industrial process that vary between product units within the set;

define, by statistical analysis of the object data, a first partitioning that assigns membership of the product units of the set between two or more subsets, the product units in each subset sharing one or more characteristics observed in the object data; and identify, at least in part based on the first partitioning of the product units and the context data, a set of one or more relevant context parameters among the context parameters, wherein the number of identified relevant context parameters for use in control of the industrial process for new product units is less than the number of context parameters identified in the received context data, so that some product units subjected to different variations of the industrial process are grouped together for the control of the industrial process for the new product units.

15. The computer program product of claim 14, wherein the instructions are further configured to cause the data processing apparatus to control the industrial process for new product units at least partially by reference to the identified set of relevant context parameters among context parameters of the new product units.

16. The computer program product of claim 14, wherein the instructions configured to identify the set of one or more relevant context parameters are further configured to at least:

(1) using the first partitioning of the product units and the context data to identify a most relevant context parameter being a parameter of the industrial process that is observed to correlate most strongly with the first partitioning;

(2) using the most relevant context parameter to define a revised partitioning by re-assigning product units to a different subset if necessary to enforce a partitioning with respect to the most relevant context parameter;

(3) repeating step (1) using the revised partitioning to identify a next most relevant context parameter; and (4) repeating step (2) using the next most relevant context parameter to further revise the first partitioning, wherein steps (3) and (4) are performed one or more times to identify a desired set of relevant context parameters.

17. The computer program product of claim 14, wherein the received object data for each product unit defines a vector representing that product unit in a multi-dimensional space, and wherein in definition of the first partitioning the statistical analysis comprises a multivariate analysis to decompose the set of the vectors representing the product units in the multidimensional space into one or more component vectors, each of the component vectors representing one of the shared characteristics.

18. The computer program product of claim 14, wherein the first partitioning is performed so as to minimize distance between members of each subset within a multidimensional space identified by the statistical analysis.

19. The computer program product of claim 14, wherein the received object data for each product unit is derived from one or more parameters measured on the product unit at points spatially distributed across the product unit or wherein the object data includes performance data representing one or more performance parameters measured on the set of product units after they have been subject to the industrial process.

20. The computer program product of claim 14, wherein the instructions are further configured to cause the computer system to generate feedforward corrections for application in processing of the new product units to modify a feedforward control by reference to the identified relevant context parameters among context parameters of the new product units.

* * * * *